United States Patent
Tsuji

(10) Patent No.: US 8,766,386 B2
(45) Date of Patent: Jul. 1, 2014

(54) SOLID-STATE IMAGING DEVICE

(75) Inventor: Shoichiro Tsuji, Shiga (JP)

(73) Assignee: Panasonic Corporation, Osaka (JP)

(*) Notice: Subject to any disclaimer, the term of this patent is extended or adjusted under 35 U.S.C. 154(b) by 96 days.

(21) Appl. No.: 13/449,374

(22) Filed: Apr. 18, 2012

(65) Prior Publication Data

US 2012/0267745 A1 Oct. 25, 2012

(51) Int. Cl.
*H01L 31/0232* (2006.01)

(52) U.S. Cl.
USPC .............................. 257/432; 438/65; 438/70

(58) Field of Classification Search
USPC ............ 257/432, E27.13, E31.13; 438/70, 65
See application file for complete search history.

(56) References Cited

U.S. PATENT DOCUMENTS

| | | |
|---|---|---|
| 2006/0158547 A1 | 7/2006 | Komatsu et al. |
| 2008/0135732 A1* | 6/2008 | Toumiya et al. ............ 250/208.1 |
| 2008/0283726 A1 | 11/2008 | Uya et al. |
| 2010/0110271 A1 | 5/2010 | Yanagita et al. |
| 2010/0291730 A1 | 11/2010 | Uya et al. |
| 2011/0058075 A1 | 3/2011 | Yanagita et al. |

FOREIGN PATENT DOCUMENTS

| | | |
|---|---|---|
| JP | 03-282403 | 12/1991 |
| JP | 08-179304 | 7/1996 |
| JP | 2001-237405 | 8/2001 |
| JP | 2005-033074 | 2/2005 |
| JP | 2006-295125 | 10/2006 |
| JP | 2006-351775 | 12/2006 |
| JP | 2008-103668 | 5/2008 |
| JP | 2009-111225 | 5/2009 |
| JP | 2010-109295 | 5/2010 |
| JP | 2011-054911 | 3/2011 |

* cited by examiner

*Primary Examiner* — Errol Fernandes
(74) *Attorney, Agent, or Firm* — Panasonic Patent Center

(57) ABSTRACT

A solid-state imaging device includes a semiconductor substrate having a photodiode formed therein, and a lamination structure of an insulating film and a wiring. The solid-state imaging device includes a partition wall formed on a wiring layer, constituted by an inorganic material and formed in a portion corresponding to a portion provided between the adjacent photodiodes, and a color filter constituted by an organic material and formed between the adjacent partition walls. The solid-state imaging device includes an adhesion layer constituted by an organic material and formed between a side surface of the partition wall and the color filter. An adhesive property of the adhesion layer to the color filter is higher than that of the partition wall to the color filter, and an adhesive property of the adhesion layer to the partition wall is higher than an adhesive property of the color filter to the partition wall.

5 Claims, 9 Drawing Sheets

SOLID-STATE IMAGING DEVICE

BACKGROUND

1. Technical Field

The present invention relates to a solid-state imaging device and a method for manufacturing the same, and more particularly to a structure of an adhesion layer formed between a color filter and a partition wall.

2. Description of the Related Art

As an example of a solid-state imaging device according to the related art, Unexamined Japanese Patent Publication No. H03-282403 describes solid-state imaging device 900 shown in FIG. 11, for example. Solid-state imaging device 900 having a plurality of pixels arranged two-dimensionally includes semiconductor substrate 910 and insulating film 920 formed on semiconductor substrate 910. Color filters 950, 952, 954 and 956 are formed on insulating film 920, and partition wall 930 is formed between color filters 950 and 952, 952 and 954, and 954 and 956 which are adjacent to each other.

With the structure, adjacent color filters 950 and 952, 952 and 954, and 954 and 956 are separated from each other and a contact surface with each other is not provided. For this reason, even if light incident on color filter 952 is scattered or reflected in color filter 952 and advances in an oblique direction, for example, the light enters adjacent color filters 950 and 954 with difficulty so that a crosstalk is suppressed.

SUMMARY

In the solid-state imaging device according to the related art, color filters 950, 952, 954 and 956 formed by an organic material are embedded in a concave portion of partition wall 930 formed by an inorganic material. Although color filters 950, 952, 954 and 956 and partition wall 930 are bonded to each other by an anchor effect, color filters 950, 952, 954 and 956 are peeled from partition wall 930. The reason is that adhesion other than mechanical bonding such as the anchor effect is generally carried out with difficulty over an interface between the inorganic material and the organic material. When color filters 950, 952, 954 and 956 are peeled from partition wall 930 so that filter missing is caused, there is a fear that image quality of a picked up image might be deteriorated.

The present invention provides a solid-state imaging device in which a color filter is peeled from a partition wall with more difficulty than that in the related art.

The solid-state imaging device according to the present invention includes a semiconductor substrate in which a plurality of light receiving parts having a photoelectric converting function is formed, and a wiring layer having a lamination structure of an insulating film and a wiring and formed on the semiconductor substrate. The solid-state imaging device includes a partition wall constituted by an inorganic material and formed on a portion of the wiring layer corresponding to a portion provided between the adjacent light receiving parts, and a color filter constituted by an organic material and formed between the adjacent partition walls on the wiring layer. The solid-state imaging device includes an adhesion layer constituted by an organic material and formed between a side surface of the partition wall and the color filter. An adhesive property of the adhesion layer to the color filter is higher than that of the partition wall to the color filter, and an adhesive property of the adhesion layer to the partition wall is higher than that of the color filter to the partition wall.

Moreover, a method for manufacturing a solid-state imaging device according to the present invention includes the step of forming a wiring layer having a lamination structure of an insulating film and a wiring on a semiconductor substrate in which a plurality of light receiving parts having a photoelectric converting function is formed. The method includes the steps of forming a partition wall constituted by an inorganic material on a portion of the wiring layer corresponding to a portion provided between the adjacent light receiving parts, and forming a color filter constituted by an organic material between the adjacent partition walls on the wiring layer. The method includes the step of forming an adhesion layer constituted by an organic material between a side surface of the partition wall and the color filter. An adhesive property of the adhesion layer to the color filter is higher than that of the partition wall to the color filter, and an adhesive property of the adhesion layer to the partition wall is higher than that of the color filter to the partition wall.

In the solid-state imaging device according to the present invention, an organic material having a higher adhesive property of the adhesion layer to the partition wall than that of the color filter to the partition wall is used as the material of the adhesion layer. Moreover, both the color filter and the adhesion layer which are formed by the organic materials have a high adhesive property. Consequently, the structure according to the present invention in which the adhesion layer is formed between the color filter and the partition wall has a higher adhesive property than that in the conventional structure in which the partition wall and the color filter are directly bonded to each other.

In the solid-state imaging device according to the present invention, accordingly, that the color filter is peeled from the partition wall with more difficulty than that in the related art.

DETAILED DESCRIPTION OF THE PREFERRED EMBODIMENTS

First Exemplary Embodiment

1. Whole Structure of Solid-State Imaging Device 100

A whole structure of solid-state imaging device 100 according to a first exemplary embodiment will be described with reference to FIG. 1.

Figure 1:
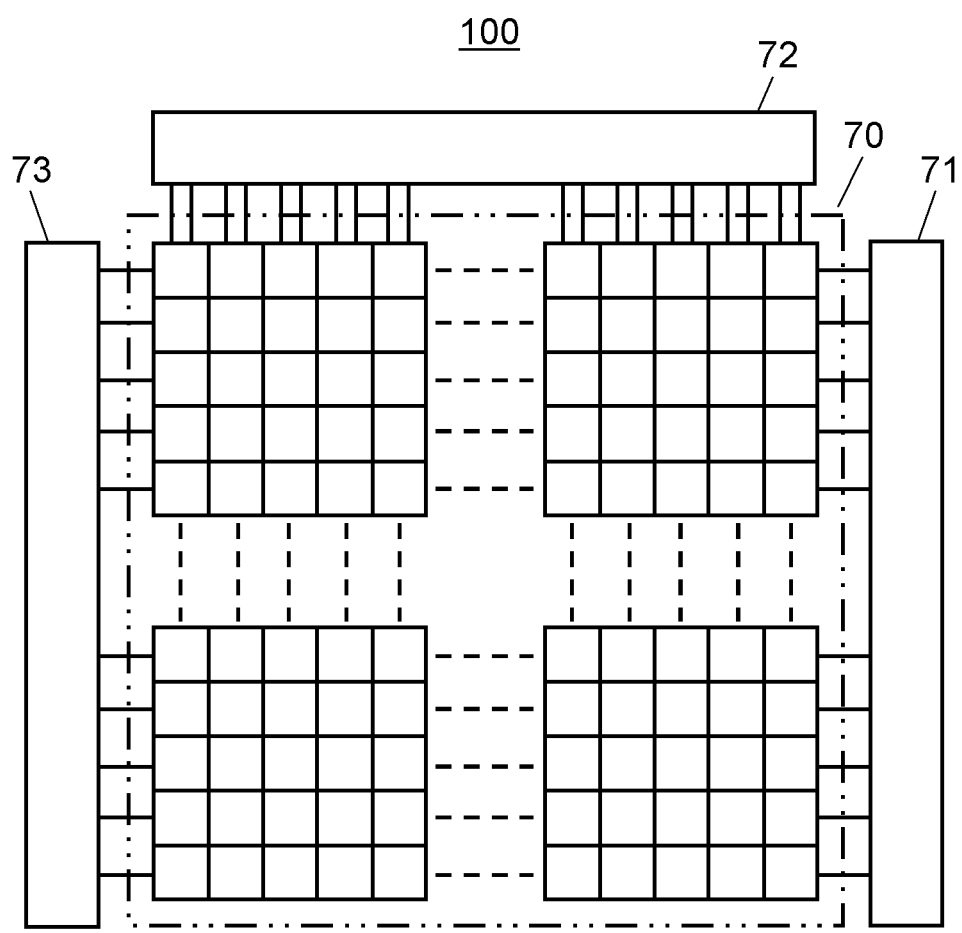
FIG. 1 is a block diagram showing a whole structure of a solid-state imaging device according to a first exemplary embodiment of the present invention.

As shown in FIG. 1, solid-state imaging device 100 has a plurality of pixels in pixel region 70, and the pixels are provided in a two-dimensional arrangement, for example, a matrix (line). Moreover, pulse generating circuit 71, horizontal shift register 72 and vertical shift register 73 are formed to surround pixel region 70. Horizontal shift register 72 and vertical shift register 73 sequentially output a driving pulse to each of the pixels in response to an application of a timing pulse sent from pulse generating circuit 71.

2. Structure of Solid-State Imaging Device 100

Figure 2:
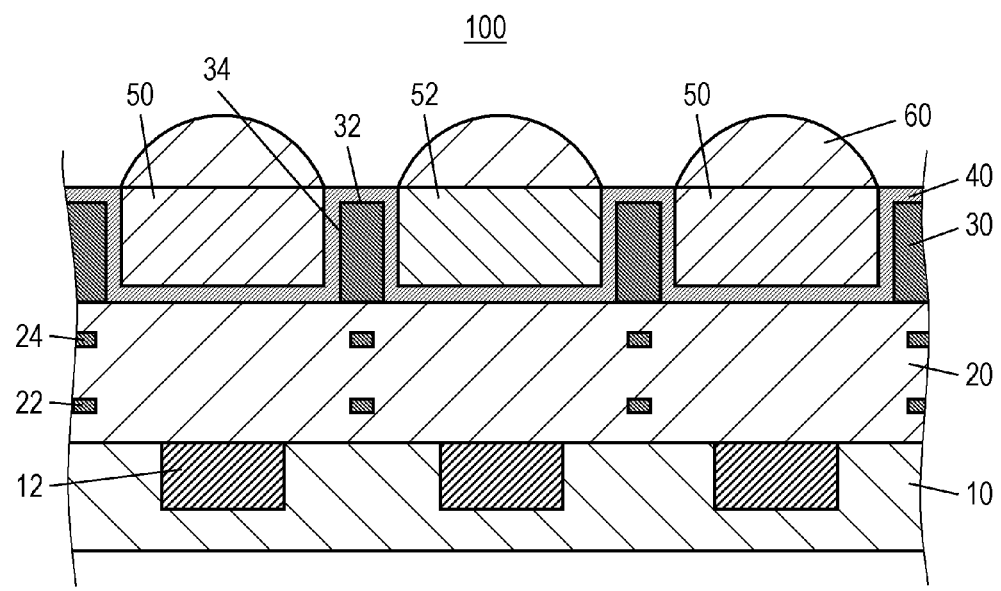
FIG. 2 is a sectional view showing the solid-state imaging device illustrated in FIG. 1.

FIG. 2 is a sectional view showing a part of pixel region 70 in solid-state imaging device 100 illustrated in FIG. 1.

As shown in FIG. 2, solid-state imaging device 100 has semiconductor substrate 10 in which photodiode 12 is formed as a light receiving part, insulating film 20 formed on semiconductor substrate 10, and partition wall 30 formed on a portion of insulating film 20 corresponding to a portion provided between adjacent photodiodes 12. Furthermore, solid-state imaging device 100 has color filters 50 and 52 formed between adjacent partition walls 30 on insulating film 20, adhesion layer 40 extended over insulating film 20 from upper surface 32 of the partition wall and side surface 34 of the partition wall, and microlens 60 formed on color filters 50 and 52. Wirings 22 and 24 are embedded in insulating film 20 and a laminated product of wirings 22 and 24 and insulating film 20 corresponds to a wiring layer. Partition wall 30 is grid-shaped as seen on a plane, and color filters 50 and 52 are formed in a square opening of partition wall 30. The color filter has three types of red (R), green (G) and blue (B) and is provided in a Bayer arrangement, for example. With the structure, color filter 50 is the green filter, and color filter 52 is the red color filter.

Light which is incident on microlens 60 is collected by microlens 60, and passes through color filters 50 and 52 and insulating film 20 and is thus incident on photodiode 12 having a photoelectric converting function.

Semiconductor substrate 10 is constituted by silicon, for example, and a gate insulating film formed on a main surface of the silicon substrate, for example, a silicon oxide film formed of $SiO_2$ is also included to obtain semiconductor substrate 10. Insulating film 20 is constituted by an inorganic material such as BPSG (Boron Phosphorus Silicon Glass) and wirings 22 and 24 are constituted by copper or aluminum, for example. Partition wall 30 is a silicon oxide film constituted by an inorganic material such as TEOS (tetraethoxysilane), for example. Color filters 50 and 52 are constituted by an organic material such as an acrylic resin containing a pigment such as copper phthalocyanine, for example. Microlens 60 is constituted by an organic material such as a novolac resin or an acrylic resin, for example. Adhesion layer 40 is constituted by an organic material such as an epoxy resin, for example. A material of the adhesion layer 40 will be described below in detail. An adhesive property of adhesion layer 40 and partition wall 30 is higher than that of color filters 50 and 52 and partition wall 30, and an adhesive property of adhesion layer 40 and color filters 50 and 52 is higher than that of partition wall 30 and color filters 50 and 52.

Color filters 50 and 52 have refractive indices of 1.5 to 1.7, and it is desirable that a refractive index of partition wall 30 should be lower than refractive indices of color filters 50 and 52 by 0.01 to 0.8, particularly, 0.2 to 0.7. Light transmitted from color filters 50 and 52 toward partition wall 30 is easily reflected by an interface between color filters 50 and 52 and partition wall 30 having a lower refractive index, and invades an inner part of partition wall 30 with difficulty and thus enters adjacent color filters 50 and 52 with difficulty. For this reason, the light is, with difficulty, incident on photodiode 12 which is different from photodiode 12 on which the light is to be originally incident so that color mixture can be reduced. Moreover, a utilization efficiency of light can be enhanced. Consequently, it is possible to implement solid-state imaging device 100 having a high sensitivity.

Figure 3:
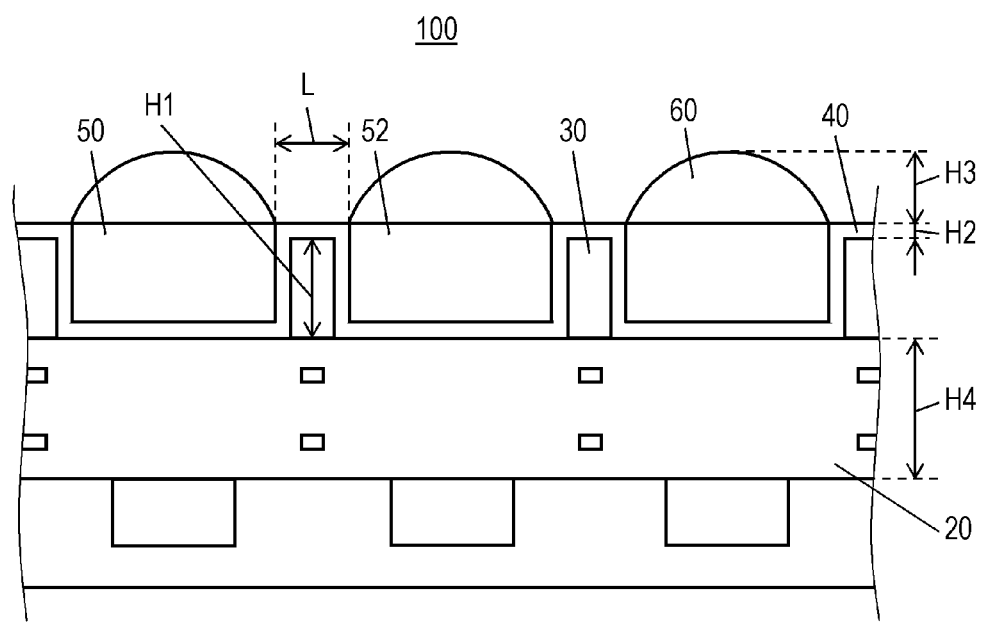
FIG. 3 is a view showing a dimension of the solid-state imaging device illustrated in FIG. 1.

FIG. 3 is a view showing a dimension of solid-state imaging device 100. It is sufficient that height H1 of partition wall 30 is 10 nm to 30000 nm, and particularly, it is desirable that height H1 should be 400 nm to 900 nm.

It is sufficient that clearance L between adjacent color filters 50 and 52 is 10 nm to 500 nm, and particularly, it is desirable that clearance L should be 100 nm to 300 nm. It is sufficient that film thickness H2 of adhesion layer 40 is 0.01 nm to 20 nm, and particularly, it is desirable that film thickness H2 should be 0.1 nm to 5 nm. It is sufficient that film thickness H3 of microlens 60 is 100 nm to 1000 nm, and particularly, it is desirable that film thickness H3 should be 200 nm to 600 nm. It is sufficient that film thickness H4 of insulating film 20 is 0.5 µm to 5 µm.

3. Manufacturing Method

Referring to a method for manufacturing solid-state imaging device 100 according to the first exemplary embodiment of the present invention, succeeding steps to a step of forming partition wall 30 which are essential parts will be mainly described with reference to FIGS. 4A to 7B.

Figure 4A:
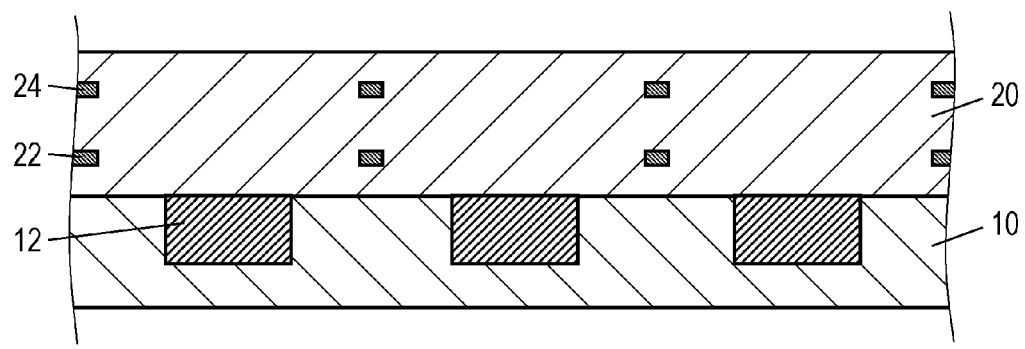
FIG. 4A is a view showing a process for manufacturing the solid-state imaging device illustrated in FIG. 1.

In FIG. 4A, semiconductor substrate 10 having photodiode 12 provided thereon and insulating film 20 having wirings 22 and 24 embedded therein are ended to be formed.

Figure 4B:
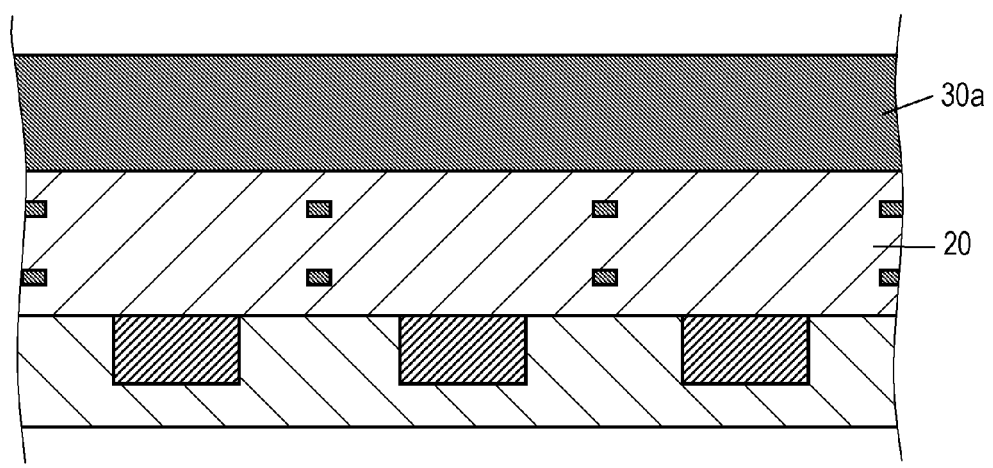
FIG. 4B is a view showing the process for manufacturing the solid-state imaging device illustrated in FIG. 1.

As shown in FIG. 4B, partition wall material 30a is provided on insulating film 20. More specifically, partition wall material 30a is applied and a film is then formed by rotation and baking or deposition.

Figure 5A:
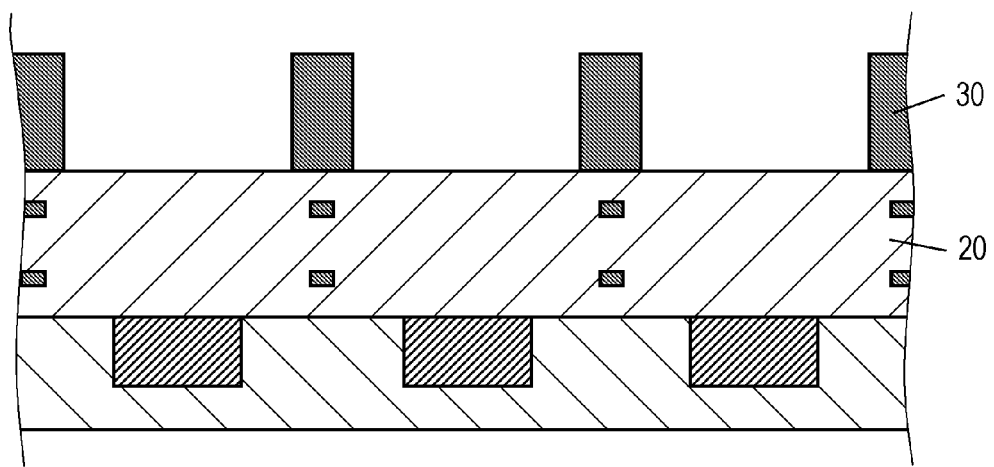
FIG. 5A is a view showing the process for manufacturing the solid-state imaging device illustrated in FIG. 1.

As shown in FIG. 5A, next, partition wall 30 is formed on insulating film 20. More specifically, a film is formed by partition wall material 30a and a mask of a pattern conforming to a shape of partition wall 30 is then used to form a resist pattern, and the resist is used as a mask to carry out etching through a dry etching method. Subsequently, the resist is removed.

Figure 5B:
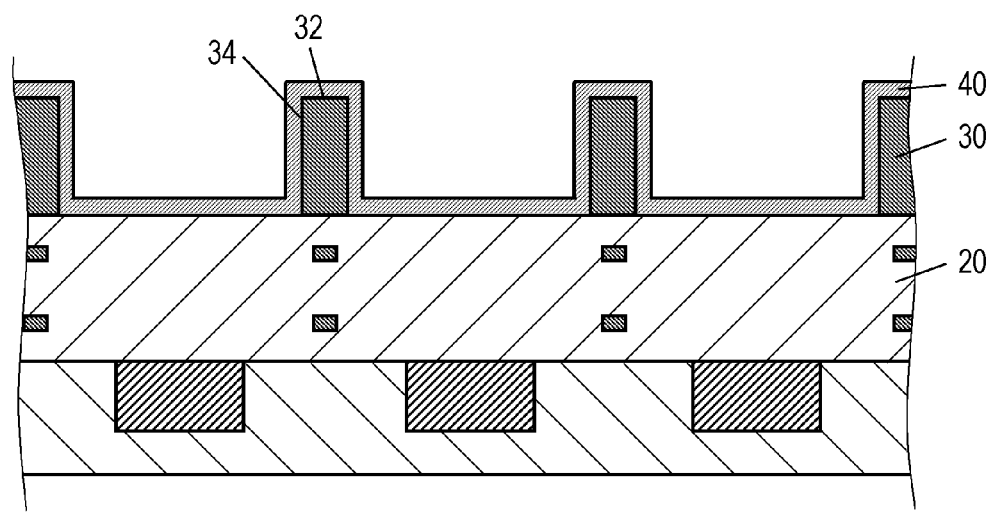
FIG. 5B is a view showing the process for manufacturing the solid-state imaging device illustrated in FIG. 1.

As shown in FIG. 5B, adhesion layer 40 is formed to be extended over insulating film 20 from upper surface 32 of the partition wall 30 and side surface 34 of the partition wall 30. Adhesion layer 40 is formed to be extended over insulating film 20 from side surface 34 of the partition wall 30. Consequently, it is possible to form adhesion layer 40 through only this step without carrying out a treatment such as etching.

More specifically, in the case in which an epoxy resin is used as adhesion layer 40, for example, a solution containing an epoxy polymer is applied onto insulating film 20 from upper surface 32 of the partition wall 30 and side surface 34 of the partition wall 30 and an epoxy polymer film is then formed by rotation and baking. At this time, a rotating speed of 500 rpm to 4000 rpm is set to be main rotation and a baking temperature is set to be 100° C. to 300° C. It is desirable that 0.01 wt % to 5 wt %, particularly, 0.1 wt % to 5 wt % of a medium in a solution to be applied for forming adhesion layer 40 should be used for the solution. Moreover, it is desirable that the solution should have a viscosity of 0.1 cP to 10 cP, particularly, 0.5 cP to 2 cP.

In order to further enhance the adhesive property, it is desirable that the baking temperature should be 200° C. to 300° C. Consequently, it is possible to form adhesion layer 40 in a film thickness of 0.01 nm to 20 nm in conformity to the shapes of partition wall 30 and insulating film 20.

Figure 6A:
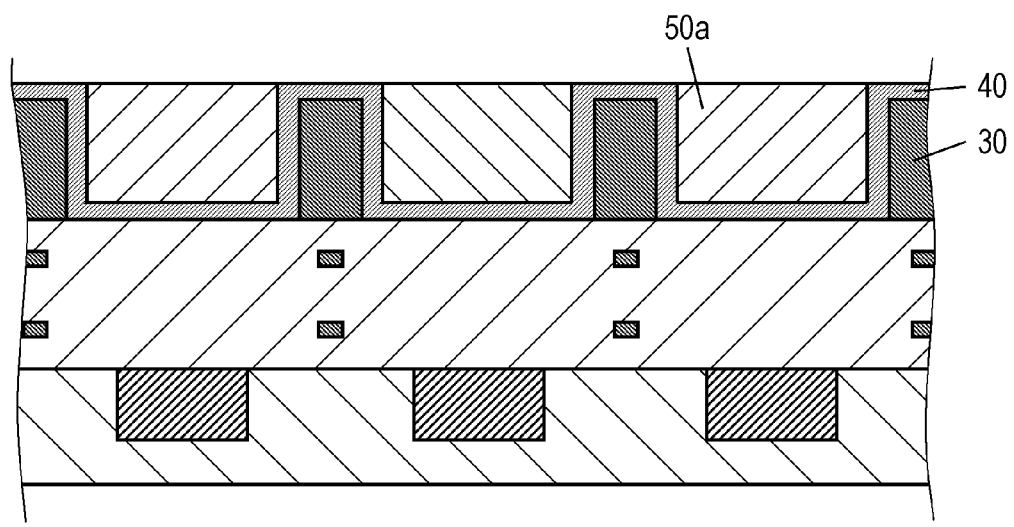
FIG. 6A is a view showing the process for manufacturing the solid-image imaging device illustrated in FIG. 1.

As shown in FIG. 6A, green color filter material 50a is applied onto adhesion layer 40. More specifically, in the case in which color filter 50 is constituted by a negative type pigment resist, 3 cc to 10 cc of the negative type pigment resist is first supplied at spinner main rotation of 500 rpm to 3000 rpm for 10 sec to apply the negative type pigment resist. Then, prebaking is carried out at a temperature of 120° C. to 170° C. for 30 sec to 150 sec.

Figure 6B:
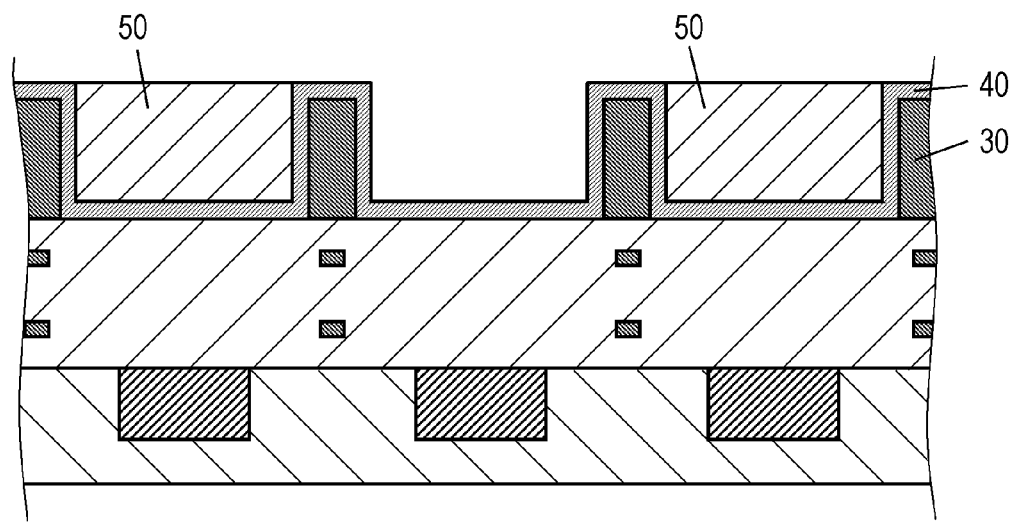
FIG. 6B is a view showing the process for manufacturing the solid-state imaging device illustrated in FIG. 1.

As shown in FIG. 6B, next, green color filter 50 is formed. More specifically, green color filter material 50a is subjected to etching to form green color filter 50. More detailed description will be given. For example, it is preferable to apply ultraviolet rays (i rays) by using a photomask, thereby exposing green color filter material 50a selectively. Furthermore, development is carried out by using an aqueous alkali developing solution and postbaking is performed at a temperature of 180° C. to 250° C. for 2 min to 5 min, thereby curing green color filter material 50a thermally. By these steps, green color filter 50 can be formed.

Figure 7A:
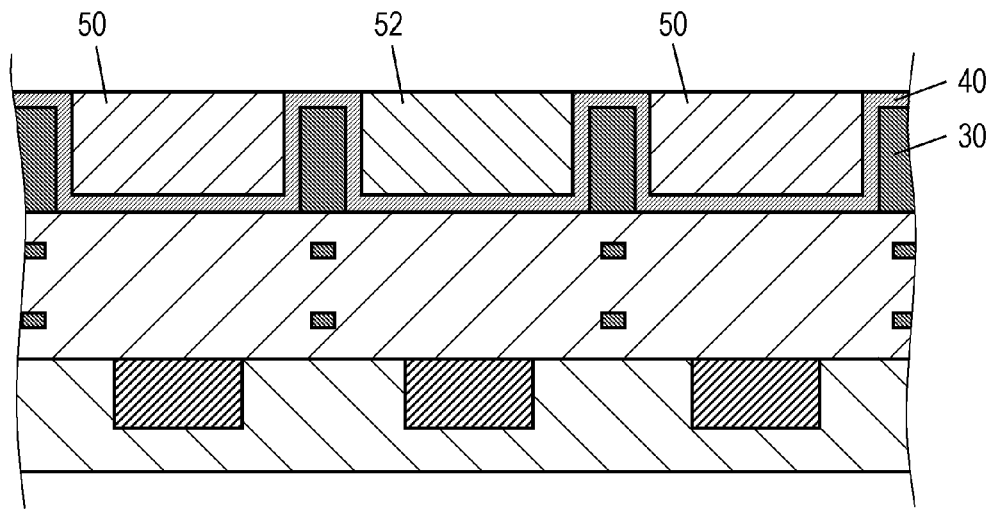
FIG. 7A is a view showing the process for manufacturing the solid-state imaging device illustrated in FIG. 1.

As shown in FIG. 7A, red color filter 52 is formed. More specifically, it is preferable to repeat the steps shown in FIGS. 6A and 6B. At the same step, then, although it is not shown, a blue color filter is also formed.

Figure 7B:
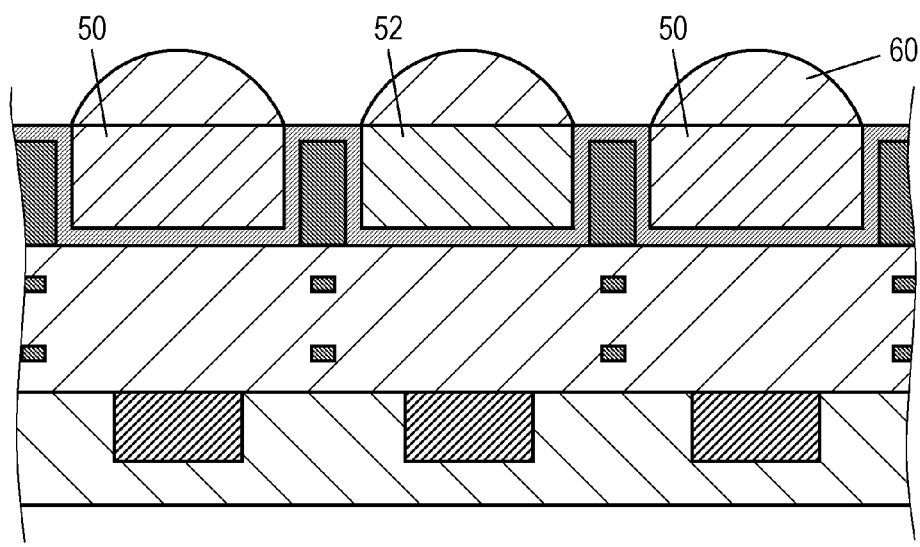
FIG. 7B is a view showing the process for manufacturing the solid-state imaging device illustrated in FIG. 1.

As shown in FIG. 7B, microlens 60 is formed on color filters 50 and 52. More specifically, a microlens material is applied onto color filters 50 and 52, and exposure and development are carried out to form microlens 60 every pixel. A spherical surface of microlens 60 is formed by heating at 150° C. to 300° C., for example. The spherical surface may be formed by exposure using a gray scale mask or by using an etch-back technique.

4. Material of Adhesion Layer and Bonding

A material of an epoxy resin which is preferred as adhesion layer 40 includes a monomer, an oligomer and a polymer which contain epoxide (a ring with three members of C—O—C). For example, it is assumed that a monomer containing an epoxy group is used as a material of adhesion layer 40 when a material of partition wall 30 is TEOS to be an inorganic material and a material of color filters 50 and 52 is an acrylic resin to be an organic material. The color filter is obtained by containing a pigment in the acrylic resin.

At this time, the epoxy group causes ring opening polymerization reaction by setting, as a base point, an oxygen atom, a nitrogen group or the like on a surface layer of partition wall 30 through heating in partition wall 30 and the monomer containing the epoxy group or the like. Consequently, an adhesive property of partition wall 30 and adhesion layer 40 can be enhanced. Furthermore, a surface layer of adhesion layer 40 has hydrophobicity. Therefore, it is possible to enhance an adhesive property of adhesion layer 40 and the acrylic resin constituting color filters 50 and 52.

For the material of adhesion layer 40, it is also possible to use HMDS (1,1,1,3,3,3-hexamethyldisilazane). Also in this case, it is possible to enhance the adhesive property of partition wall 30 and adhesion layer 40. Moreover, the surface layer of adhesion layer 40 is made hydrophobic through silanization. Therefore, it is possible to enhance the adhesive property of adhesion layer 40 to the acrylic resin constituting color filters 50 and 52. In the case in which the HMDS is used, the adhesion layer 40 can be formed by deposition. More specifically, if the baking temperature is equal to or higher than 50° C. in a unit in an HMDS atmosphere after the formation of the partition wall shown in FIG. 5A, the adhesion layer 40 is deposited on the surface of the partition wall 30. In particular, the adhesive property is more excellent if the baking temperature is 90° C. to 150° C. Moreover, it is also possible to form a film through coating rotation.

5. Effect

With the structure, the adhesive property of adhesion layer 40 to color filters 50 and 52 is higher than that of partition wall 30 to color filters 50 and 52, and the adhesive property of adhesion layer 40 to partition wall 30 is higher than that of color filters 50 and 52 to partition wall 30. For this reason, color filters 50 and 52 are peeled from partition wall 30 with more difficulty and filter missing is caused with more difficulty as compared with the related art. As a result, it is possible to suppress deterioration in image quality of a picked up image.

Moreover, adhesion layer 40 can be formed uniformly and thinly. Therefore, incident light is intercepted by adhesion layer 40 with difficulty, and an optical characteristic of solid-state imaging device 100 is deteriorated with difficulty even if adhesion layer 40 is present. Even if adhesion layer 40 is present, therefore, it is possible to suppress deterioration in an image which is picked up.

Second Exemplary Embodiment

1. Structure

Figure 8:
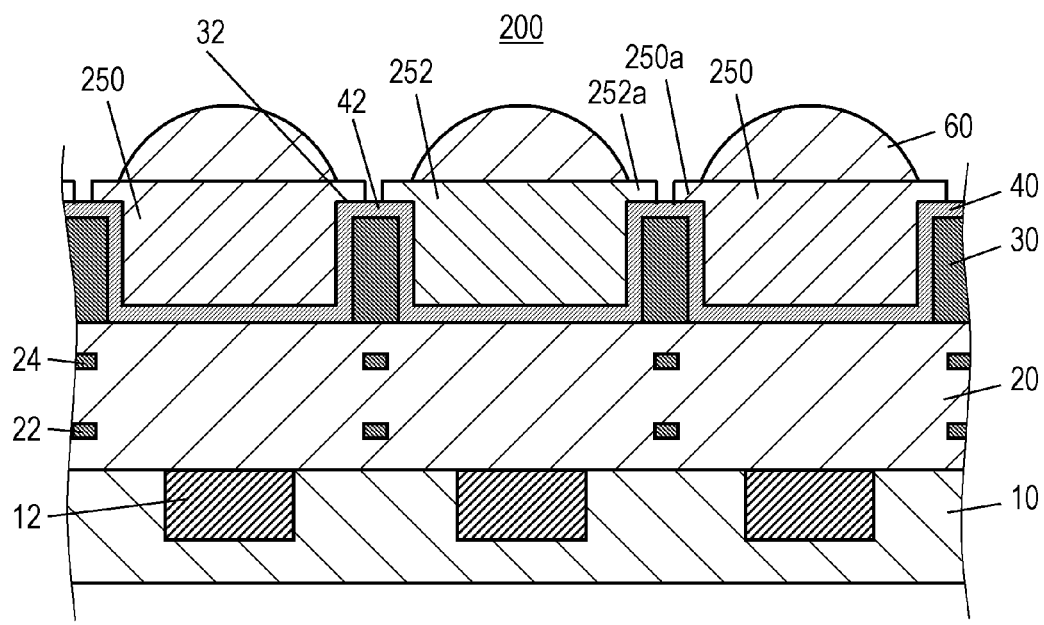
FIG. 8 is a sectional view showing a solid-state imaging device according to a second exemplary embodiment of the present invention.

FIG. 8 is a sectional view showing solid-state imaging device 200 according to a second exemplary embodiment. Since structures other than the following structure are the same as those of solid-state imaging device 100, description will be omitted.

Color filters 250 and 252 are further extended like a flange over upper part 42 of adhesion layer 40 which spreads over upper surface 32 of a partition wall 30. Moreover, upper parts 250a and 252a of adjacent color filters are separated from each other over upper surface 32 of the partition wall 30.

2. Effect

Upper parts 250a and 252a of color filters and upper part 42 of the adhesion layer are provided in contact with each other, and a contact area of color filters 250 and 252 and adhesion layer 40 is increased more greatly. Therefore, color filters 250 and 252 are peeled from partition wall 30 with more difficulty so that image quality of a picked up image can be prevented from being deteriorated by filter missing.

Furthermore, upper parts 250a and 252a of the adjacent color filters are separated from each other. Therefore, incident light can be prevented from entering adjacent color filters 250 and 252 from a contact surface of upper parts 250a and 252a of the color filters. Consequently, it is possible to suppress color mixture between adjacent color filters 250 and 252. Thus, it is possible to suppress the deterioration in the image quality of the picked up image.

Third Exemplary Embodiment

Figure 9:
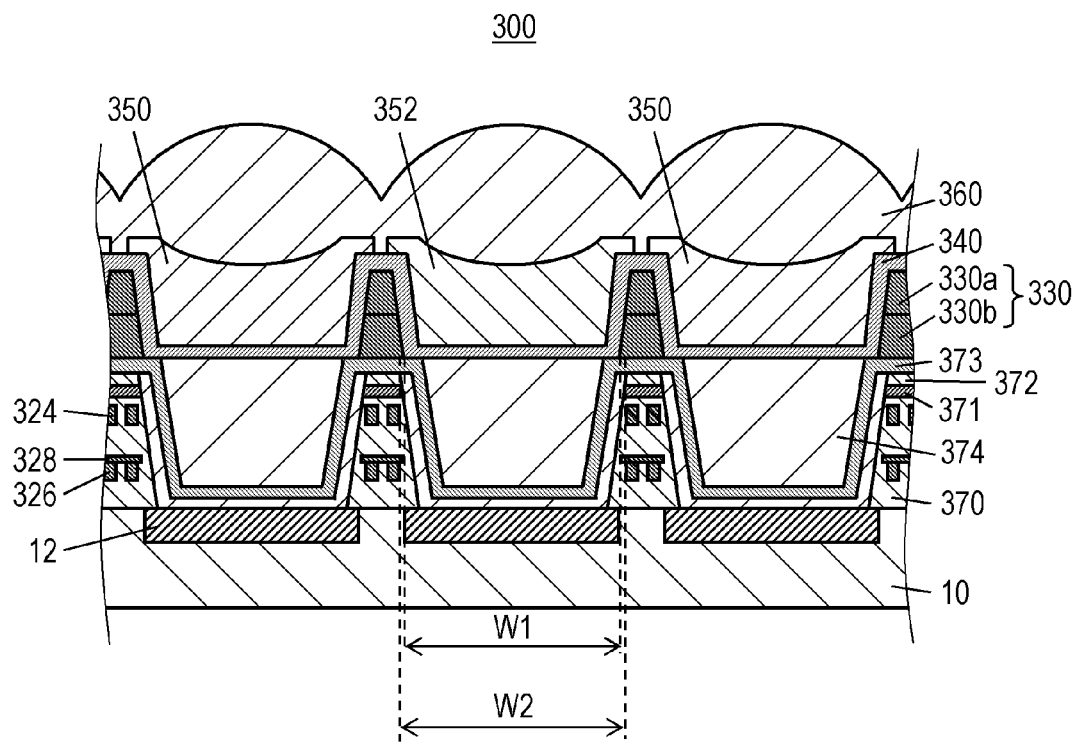
FIG. 9 is a sectional view showing a solid-state imaging device according to a third exemplary embodiment of the present invention.

FIG. 9 is a sectional view showing solid-state imaging device 300 according to a third exemplary embodiment. Since structures other than the following structure are the same as those in solid-state imaging device 200, description will be omitted.

First insulating films 370, second insulating film 372, third insulating film 373 and fourth insulating film 374 are formed on semiconductor substrate 10. Second insulating film 372, third insulating film 373 and fourth insulating film 374 constitute an optical waveguide. Wirings 324 and 326 and diffusion preventing film 328 are embedded in first insulating film 370. Diffusion preventing film 328 prevents a copper atom to be a material from being diffused onto insulating film 370 when forming wiring 326.

When a cell size of solid-state imaging device 300 is set to be 1.4 μm, it is preferable that a height of partition wall 330 should be 600 nm to 800 nm, a width of upper layer 330a should be 150 nm to 250 nm, and a width of lower layer 330b should be 200 nm to 400 nm. Moreover, it is more preferable that a height of partition wall 330 should be 700 nm, a width of upper layer 330a should be 200 nm, and a width of lower layer 330b should be 300 nm. With the structure, furthermore, opening width W1 at a lower end of partition wall 330 and opening width W2 at an upper end of the optical waveguide are set in such a manner that a virtual line passes through an inside of the upper end of the optical waveguide if it is assumed that an inside slant surface of partition wall 330 is extended downward. Consequently, light passing through color filters 350 and 352 is guided to the optical waveguide without leakage.

For example, first insulating film 370 is formed of silicon oxide, second insulating film 372 is formed of silicon nitride, third insulating film 373 is formed of silicon oxynitride, and fourth insulating film 374 is formed of silicon nitride. When refractive indices of first insulating film 370 is represented by n1, a refractive index of second insulating film 372 is represented by n2, a refractive index of third insulating film 373 is represented by n3, and a refractive index of fourth insulating film 374 is represented by n4, the following relationship is satisfied.

$$n2 > n1 \quad \text{[Equation 1]}$$

$$n3 < n2 \quad \text{[Equation 2]}$$

$$n4 > n3 \quad \text{[Equation 3]}$$

If there is employed a structure in which n1 is 1.45, for example, it is preferable that n2 should be 1.9 to 2.0, n3 should be 1.6 to 1.8, and n4 should be 1.9 to 2.0. With the structure, by employing a double optical confinement structure in the optical waveguide, it is possible to reduce leakage of light to first insulating film 370, thereby enhancing a light collection efficiency. Thus, it is possible to implement solid-state imaging device 300 having a high sensitivity.

Partition wall 330 is constituted by upper layer 330a and lower layer 330b. Both upper layer 330a and lower layer 330b which constitute partition wall 330 are silicon oxide films and have refractive indices of approximately 1.4 to 1.5. Moreover, an interface is present between upper layer 330a and lower layer 330b and light advancing in partition wall 330 from an upper part toward a lower part through the interface is reflected so that a downward invasion of the light is suppressed. Consequently, it is possible to suppress color mixture, thereby reducing deterioration in image quality of a picked up image.

Color filters 350 and 352 are formed between adjacent partition walls 330, on first to fourth insulating films 370, 372, 373, 374 and wirings 324, 326. Adhesion layer 340 is formed between side surface of partition wall 330 and color filters 350 and 352.

Upper surfaces of color filters 350 and 352 take concave shapes. Therefore, it is possible to further enhance a light collection ratio. Thus, it is possible to implement solid-state imaging device 300 having a higher sensitivity.

Moreover, microlens 360 is formed to be extended over partition wall 330.

Fourth Exemplary Embodiment

Figure 10:
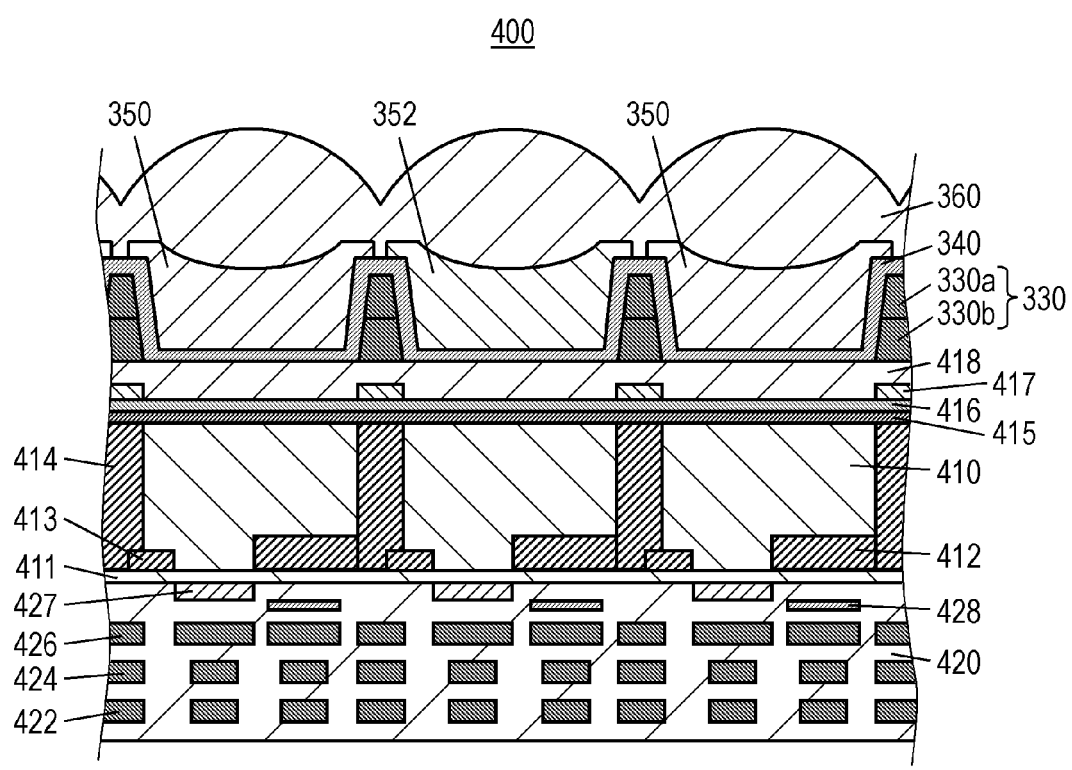
FIG. 10 is a sectional view showing a solid-state imaging device according to a fourth exemplary embodiment of the present invention.
Figure 11:
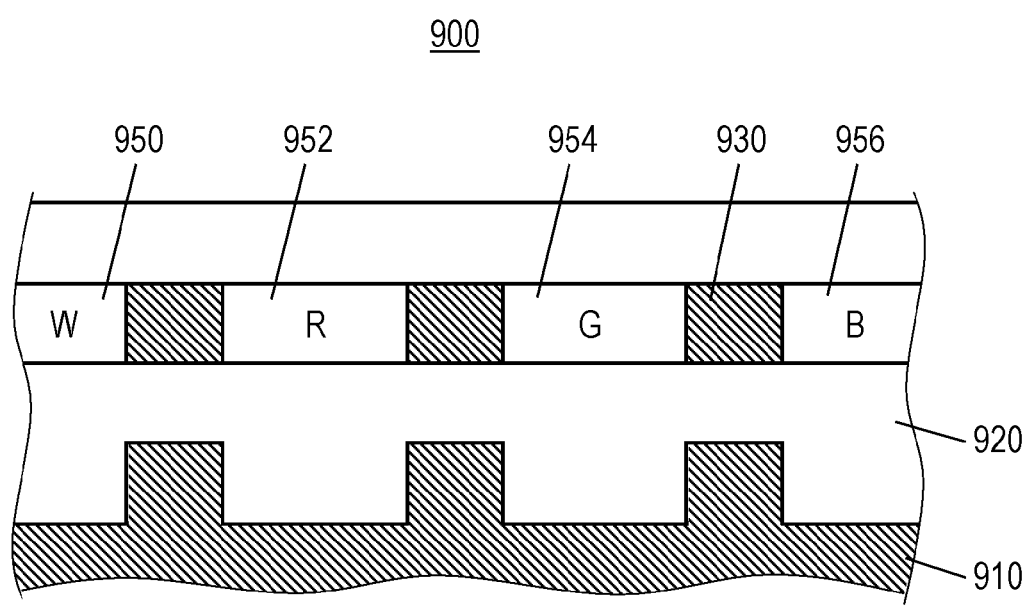
FIG. 11 is a view showing a structure of a conventional solid-state imaging device.

FIG. 10 is a sectional view showing solid-state imaging device 400 according to an exemplary embodiment. Since structures other than the following structure are the same as those in solid-state imaging device 300, description will be omitted.

Solid-state imaging device 400 to be a backside illumination type CMOS image sensor is separated every pixel through P type well region 414 to be a pixel separating region, and has semiconductor substrate 410, gate insulating film 411, photodiode 412, n$^+$ region 413, and hole storage layer 415. Moreover, solid-state imaging device 400 has first silicon oxide film 416 formed by thermal oxidation, metal shielding film 417 formed on first silicon oxide film 416 in pixel separating region, and second silicon oxide film 418 formed on first silicon oxide film 416 excluding pixel separating region by CVD. The metal shielding film 417 is formed of aluminum or tungsten, for example.

At a side opposite to microlens 360 as seen from semiconductor substrate 410, insulating film 420 having wirings 422, 424 and 426 embedded therein is disposed and reflecting film 428 constituted by the same material as wirings 422, 424 and 426 is formed. Gate electrode 427 is formed under gate insulating film 411 between photodiode 412 and n$^+$ region 413.

Light which is incident on photodiode 412 via color filters 350 and 352 from microlens 360 is converted into a signal charge. Most of light transmitted toward insulating film 420 is reflected by reflecting film 428 and wirings 422, 424 and 426 in a direction of semiconductor substrate 410. Therefore, it is possible to enhance a sensitivity of solid-state imaging device 400.

Variant

1. Color Filter

Although the red color filter, the green color filter and the blue color filter are described in each exemplary embodiment and the like, the present invention is not restricted thereto but it is also possible to use a magenta color filter, a cyan color filter or the like, for example. Moreover, it is possible to optionally select a color and an arrangement of the color filter.

As a pigment of the color filter, it is possible to use well-known inorganic and organic pigments. Further, in consideration of the fact that a high transmittance is preferred, it is preferable to use a pigment having a small average particle size. Furthermore, in consideration of a handling property, the average particle size of the pigment is preferably 0.01 μm to 0.1 μm and is more preferably 0.01 μm to 0.05 μm. More specifically, a preferred pigment includes the following, for example.

C. I. pigment yellow 11, 24, 108, 109, 110, 138, 139, 150, 151, 154, 167, 180, 185;

C. I. pigment orange 36, 71;

C. I. pigment red 122, 150, 171, 175, 177, 209, 224, 242, 254, 255, 264;

C. I. pigment violet 19, 23, 32;

C. I. pigment blue 15:1, 15:3, 15:6, 16, 22, 60, 66;

C. I. pigment black 1

Moreover, the shape of the color filter is not restricted to be the square shape described in the exemplary embodiments but may be a circular shape, a hexagonal shape or the like, for example.

2. Partition Wall

Although the partition wall 30, 330 is grid-shaped as seen on a plane and the color filter is formed on the square opening of the partition wall 30, 330, the opening may take a shape other than the square shape, for example, a rectangular shape, a circular shape, an elliptical shape, a polygonal shape or the like.

Although the partition wall 30, 330 is constituted by the silicon oxide film using the TEOS as a material in the exemplary embodiments, moreover, the present invention is not restricted thereto but it is also possible to use other inorganic materials such as BPSG (Boron Phosphorus Silicate Glass), SiON and the like, for example.

3. Others

In addition to the CMOS image sensor described in the exemplary embodiments, it is also possible to use the present invention in a structure utilizing a waveguide, a backside illumination type CMOS image sensor and a CCD type image sensor, for example.

Although the inorganic material such as BPSG is used as the insulating film 20, 370 in the exemplary embodiment, the present invention is not restricted thereto but an organic material such as a polyimide resin may be used, for example. In the case in which the inorganic material is used as the insulating film 20, 370, it is possible to form a film having a thickness of 0.5 μm to 5 μm by plasma CVD or physical vapor deposition. In the case in which a resin is used as the insulating film 20, 370, it is preferable to apply a resin having a film thickness of 0.5 μm to 5 μm onto a semiconductor substrate and to then carry out heat curing on a condition of a temperature of 180° C. to 250° C. for 2 minutes to 5 minutes.

The structure of the solid-state imaging device according to the present invention or the like is not restricted to the structures of the solid-state imaging devices according to the exemplary embodiments and the variant but various changes and applications can be made within a range in which the effect of the present invention can be produced. It is possible to replace the process used in each of the steps with other equivalent processes without departing from the technical thought. Moreover, step order can be replaced and materials can also be changed.

The present invention is useful for implementing a solid-state imaging device serving as an imaging device to be provided on a digital still camera, a digital video camera, a monitoring camera, an in-vehicle camera or the like.

What is claimed is:

1. A solid-state imaging device, comprising:
   a semiconductor substrate in which a plurality of light receiving parts having a photoelectric converting function is formed;
   a wiring layer having a lamination structure of an insulating film and a wiring and formed on the semiconductor substrate;
   a partition wall formed on a portion corresponding to a portion of the wiring layer provided between the adjacent light receiving parts;
   a color filter constituted by an organic material and formed between the adjacent partition walls on the wiring layer; and
   an adhesion layer constituted by an organic material and formed between a side surface of the partition wall and the color filter,
   wherein an adhesive property of the adhesion layer to the color filter is higher than that of the partition wall to the color filter,
   an adhesive property of the adhesion layer to the partition wall is higher than that of the color filter to the partition wall,
   the adhesion layer is further extended to cover an upper surface of the partition wall; and
   the color filter is further extended like a flange over a portion of the adhesion layer which spreads over the upper surface of the partition wall.

2. The solid-state imaging device according to claim 1, wherein the adjacent color filters are separated from each other over the upper surface of the partition wall.

3. The solid-state imaging device according to claim 1, wherein the adhesion layer is further extended continuously from the side surface of the partition wall to a portion provided under the color filter on the wiring layer.

4. The solid-state imaging device according to claim 1, wherein the adhesion layer is constituted by an epoxy resin.

5. The solid-state imaging device according to claim 1, wherein the partition wall is constituted by an inorganic material.

* * * * *